United States Patent
Abadeer et al.

(10) Patent No.: US 7,659,497 B2
(45) Date of Patent: Feb. 9, 2010

(54) ON DEMAND CIRCUIT FUNCTION EXECUTION EMPLOYING OPTICAL SENSING

(75) Inventors: Wagdi W. Abadeer, Jericho, VT (US); James W. Adkisson, Jericho, VT (US); Jeffrey S. Brown, Middlesex, VT (US); Kiran V. Chatty, Williston, VT (US); Robert J. Gauthier, Jr., Hinesburg, VT (US); Michael J. Hauser, Bolton, VT (US); Jed H. Rankin, South Burlington, VT (US); William R. Tonti, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 175 days.

(21) Appl. No.: 11/275,058

(22) Filed: Dec. 6, 2005

(65) Prior Publication Data

US 2006/0050457 A1 Mar. 9, 2006
US 2007/0127172 A1 Jun. 7, 2007

(51) Int. Cl.
*G01J 1/44* (2006.01)
*H01L 23/62* (2006.01)
(52) U.S. Cl. .................... 250/206; 250/214 R; 257/356
(58) Field of Classification Search ................. 250/206, 250/214 R, 214.1, 208.1, 214 A, 214 LA, 250/214 C, 214 SW, 214 LS; 257/209, 529, 257/356, 312, 314
See application file for complete search history.

(56) References Cited

U.S. PATENT DOCUMENTS

| | | | | |
|---|---|---|---|---|
| 523,480 A | * | 7/1894 | Dara | 188/217 |
| 4,935,636 A | * | 6/1990 | Gural | 250/578.1 |
| 5,485,032 A | | 1/1996 | Schepis et al. | |
| 5,546,371 A | * | 8/1996 | Miyazaki | 369/112.15 |
| 5,547,879 A | * | 8/1996 | Dierschke et al. | 438/73 |
| 5,606,482 A | * | 2/1997 | Witmer | 361/93.7 |
| 6,137,192 A | * | 10/2000 | Staffiere | 307/130 |
| 6,392,468 B1 | | 5/2002 | Wu | |
| 6,501,288 B1 | * | 12/2002 | Wilsher | 324/753 |
| 6,768,694 B2 | | 7/2004 | Anand et al. | |
| 6,913,954 B2 | | 7/2005 | Kothandaraman | |
| 7,208,783 B2 | * | 4/2007 | Palsule et al. | 257/233 |
| 2002/0053742 A1 | * | 5/2002 | Hata et al. | 257/774 |
| 2003/0141434 A1 | * | 7/2003 | Ishikawa et al. | 250/208.1 |

FOREIGN PATENT DOCUMENTS

CN 1682375 10/2005

* cited by examiner

*Primary Examiner*—Georgia Y Epps
*Assistant Examiner*—Don Williams
(74) *Attorney, Agent, or Firm*—Scully, Scott, Murphy & Presser, P.C.; Richard M. Kotulak, Esq.

(57) ABSTRACT

Disclosed is a method of executing an electrical function, such as a fusing operation, by activation through a chip embedded photodiode through spectrally selected external light activation, and corresponding structure and circuit. The present invention is based on having incident light with specific intensity/wave length characteristics, in conjunction with additional circuit elements to an integrated circuit, perform the implementation of repairs, i.e., replacing failing circuit elements with redundant ones for yield and/or reliability. Also to perform disconnection of ESD protection device from input pad once the packaged chip is placed in system. No additional pins on the package are necessary.

15 Claims, 6 Drawing Sheets

ON DEMAND CIRCUIT FUNCTION EXECUTION EMPLOYING OPTICAL SENSING

BACKGROUND OF THE INVENTION

1. Field of the Invention

This invention generally relates to integrated circuits, and more particularly to executing an electrical function, such as a fusing operation, in an integrated circuit and to a method of manufacture thereof.

2. Background Art

Fuses and antifuses are programmable electronic devices that are used in a variety of circuit applications. A fuse is normally closed, and when blown or programmed results in an "open" or increase in resistance. An antifuse is similar to a fuse in that it is programmable. However, an antifuse is normally open, having a capacitor-like structure. When an antifuse is blown or programmed, this results in a short, or decreased resistance.

There are many applications for fuses and antifuses. One particular application in integrated circuits is to improve yields using redundancy. By providing, for example, redundant memory cells on memory chips, the circuits or modules that are defective or not needed may be eliminated from circuit operation, thus improving the yield. This may be accomplished by programming fuses or antifuses to alter, disconnect or bypass active cells or circuits and allow redundant memory cells to be used in place of cells that are not functional. Similarly, information may be rerouted using fuses and/or antifuses.

Another exemplary application for fuses and antifuses is for customizing integrated circuits (IC's) after production. One IC configuration may be used for multiple applications by programming the fuses and/or antifuses (e.g., by blowing or rupturing selected fuses and antifuses) to deactivate and select circuit paths. Thus, a single integrated circuit design may be economically manufactured and adapted for a variety of custom uses.

Fuses and antifuses may also be used to program chip identification (ID) after an integrated circuit is produced. A series of ones and zeros can be programmed in to identify the IC so that a user will know its programming and device characteristics, as examples.

Typically, fuses or fusible links are incorporated into an integrated circuit design, and then these fuses or fusible links are selectively programmed, e.g., blown or ruptured, by passing an electrical current of sufficient magnitude through the selected fuses to cause them to melt and break the connection.

It is thus desirable to enhance yield of integrated chips by including redundant elements that could replace some specific faulty circuits or components on the chip following testing after fabrication. It is also equally important to have the means to repair failing chips during normal field operation by replacing some failing parts of the chip with redundant elements, thus in effect improving overall reliability and serviceability.

In technologies employing optical imaging sensors, the enhancement of yield and reliability can be done by incorporating the features of the technology regarding optical detection. One specific example pertaining to optical imaging technologies is the extensive use of capacitors for charge integration. These capacitors, with large amount could have an effect on yield and reliability and thus having redundant capacitor circuits that could be implemented to hardware before shipment to customers, and providing repair during usage would be very beneficial. Such implementation of redundant elements for both yield and reliability normally requires additional pins at the package level where programming, to execute implementation of repair, could be performed at the package level. In many applications and designs, it is not convenient or possible to have additional pins at the package level for such implementation.

SUMMARY OF THE INVENTION

An object of this invention is to improve executable electrical functions, such as fusing operations, used in integrated circuits.

Another object of the invention is to execute functions, by simple commands, for yield/performance or reliability in integrated circuits using optical sensor technology.

A further object of the present invention is to execute an electrical function, such as a fusing operation, in an integrated circuit by activation through a chip-embedded photodiode through spectrally selected external light activation.

Another object of this invention is to provide an integrated circuit, and a method of fabricating an integrated circuit, having a chip-embedded photodiode for executing electrical functions by spectrally selected external light activation of said photodiode.

These and other objectives are attained with a method of executing an electrical function, such as a fusing operation, by activation through a chip embedded photodiode through spectrally selected external light activation, and corresponding structure and circuit. The present invention is based on having incident light with specific intensity/wave length characteristics, in conjunction with additional circuit elements to an integrated circuit, perform the implementation of repairs, i.e., replacing failing circuit elements with redundant ones for yield and/or reliability. No additional pins on the package are necessary.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The invention will now be described by reference to the accompanying figures. In these figures, various aspects of the structures have been shown and schematically represented in a simplified manner to more clearly describe and illustrate the invention. For example, the figures are not intended to be to scale. In addition, various aspects of the structures are illustrated as having particular shapes; however, as those skilled in the art will appreciate, the invention is not limited to constructions of any particular shape.

Figure 1:
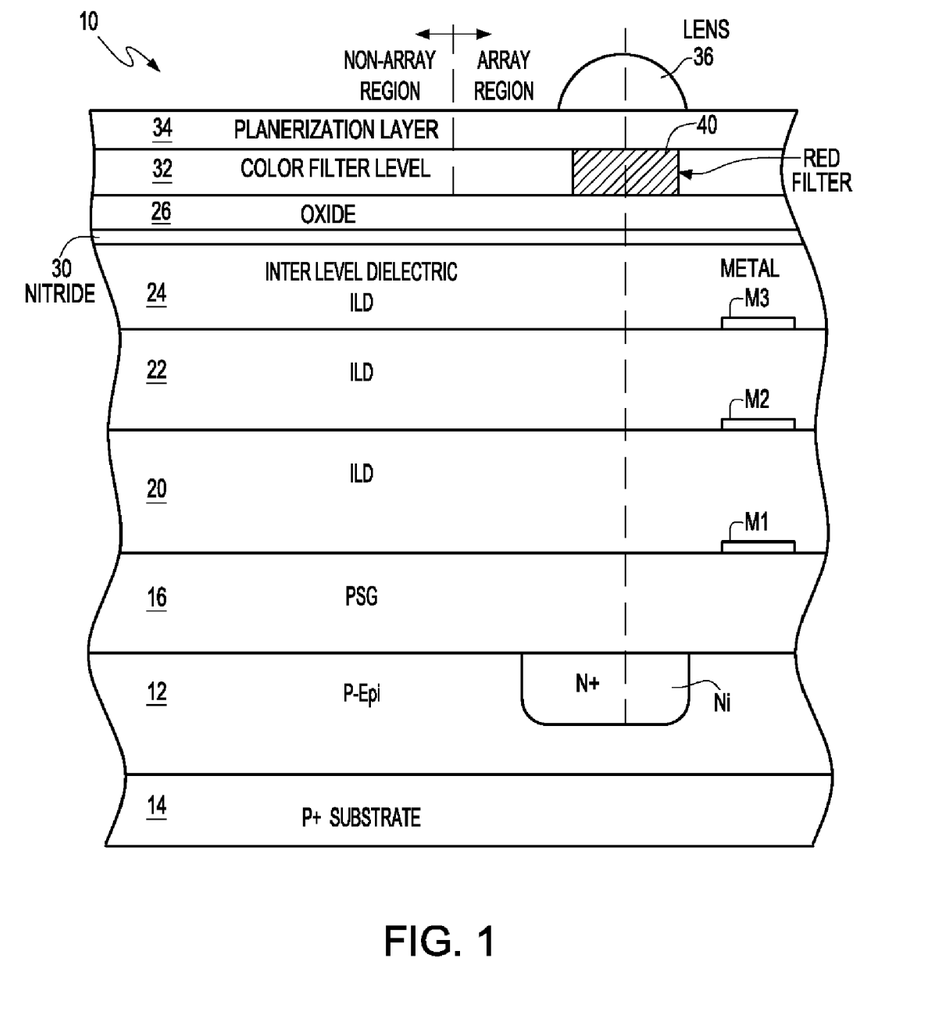
FIG. 1 is a cross-sectional view of an integrated circuit having optical sensor mask levels.

As mentioned above, this invention generally relates to integrated circuits or semiconductor structures, and FIG. 1 shows a cross-section of the process levels of an integrated circuit 10 associated with executing the functions of the preferred embodiment of this invention. Generally, integrated circuit 10 may include conventional processing levels, with a photodiode N1 formed with N+ impurities in a p-epi region 12 of P+ substrate 14. The following process levels are conventional with integrated circuit processing comprising of a PSG (Phospho silicate glass) 16, interlevel dielectric layers (ILD) 20, 22, 24, and metal levels: M1, M2, and M3. The upper process layers comprise final passivation layers 26, 30 of oxide and nitride followed by a color filter level 32, then a planarization layer 34 and micro lenses 36. For executing the functions of this invention, a red color filter is chosen, so that it is sensitive only to red color which is employed for executing the fuse operation, explained in more detail below. Thus when the fuse operation is not executed, the preferred circuit used in the present invention would not be sensitive to normal light present.

Structure 10 may be made in any suitable way. Lower substrate 14 may be made of any suitable material, and for example, this substrate may be a bulk silicon substrate. Layer 26, as mentioned above, is preferably comprised of an oxide material, and is deposited in any suitable way. Semiconductor region 12 may be formed by providing a suitable substrate, and then implanting P-type dopants to form the P-epi layer and implanting N-type dopants to form photodiode N1. Any suitable dopants may be used to form the N- and P-regions; and for example, the N-type dopants may be phosphorous or arsenic ions, and the P-type dopants may be boron ions. Also, any suitable masking technique or other suitable targeted ion implantation process may be used to implant the N and P type dopants in the desired areas of region 12.

Figure 2:
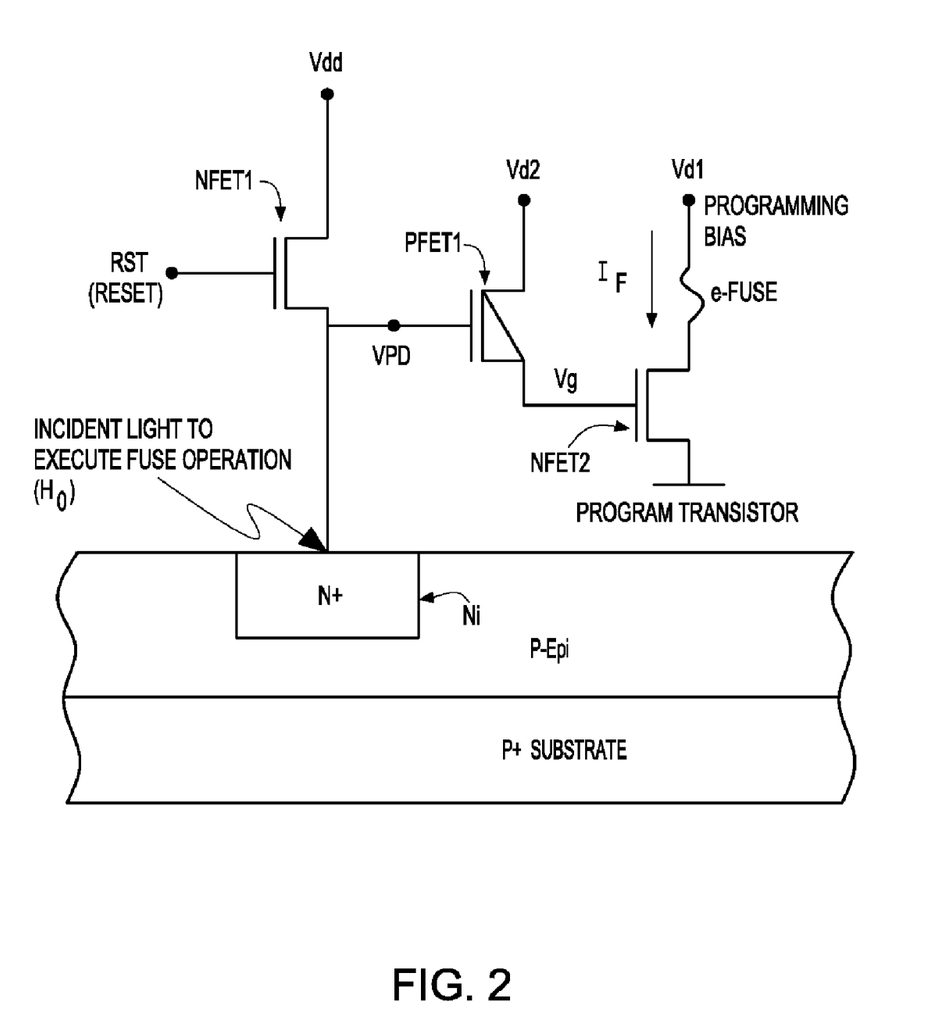
FIG. 2 is a circuit diagram showing an optically activated electronic fuse.

FIG. 2 shows the photo diode diffusion N1 with a preferred circuitry associated with executing the functions of this invention. The photo diode N1 will have incident light on it designed for execution of, for example, a fuse operation. The transistor NFET1 performs the reset function for the photo diode. As the reset input (RST) is high, NFET1 is turned "ON" and N1 is charged to voltage Vdd. When RST goes low, the voltage on diffusion N1 begins to decay with time according to the generation-recombination process in the vicinity of N1 and the amount of incident light. When the voltage across N1 (VPD) reaches the detection level, which is a threshold voltage below Vd2, the transistor PFET1 is turned "ON", and the gate of transistor NFET2 (Vg) goes to Vd2, which is higher than the threshold voltage of transistor NFET2, and thus NFET2 will be "ON" and the fusing operation is performed at e-fuse. It should be noted that, for the sake of clarity, FIG. 2 does not show details of how the fusing operation replaces bad circuit elements by good ones, or how the ESD protection device is disconnected from input pad once the packaged chip is placed in the system. These details are well known and understood in the art.

Figure 3:
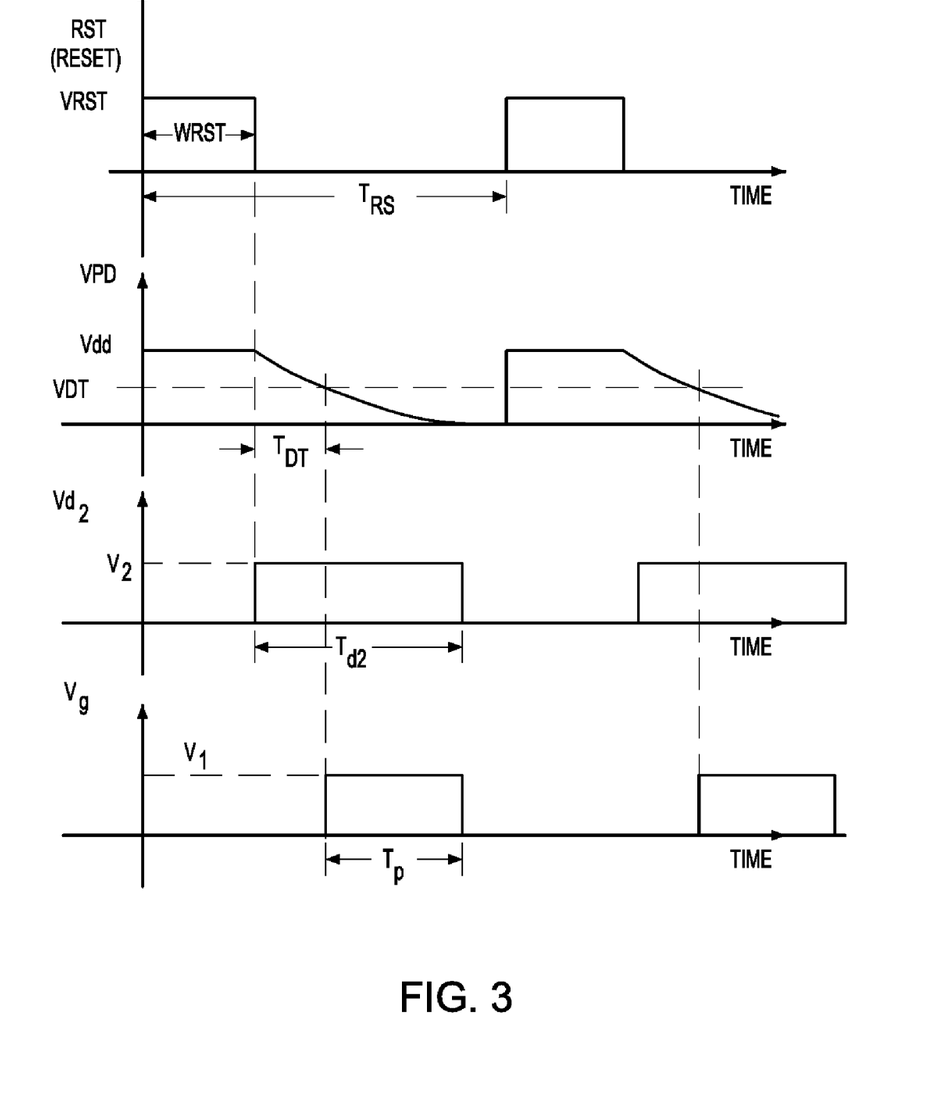
FIG. 3 is a timing diagram showing how various voltages change over time in the operation of the circuit of FIG. 2.

The details of the timing diagrams for the fusing operation are shown in FIG. 3. The reset signal for the photo diode N1, RST, has a width of WRST and a period of TRS. RST may be generated in any suitable way. For example, RST may be generated from a pixel clock, which is a type of clock that many integrated chips have for performing normal pixel functions of the chips, and which normally will have a higher frequency than RST.

With reference to FIGS. 2 and 3, as RST is applied, N1 will be charged to voltage Vdd through NFET1, and when RST goes to zero, N1 begins to decay according to the following:

$$C(V) \times dV(t)/dt = -(Igr + IP) \quad (1)$$

Where C(V) is the junction capacitance of N1, V(t)=VPD, is the voltage across N1, Igr is the generation-recombination current associated with the depletion layer of N1, and IP is the photo current. When the voltage VPD reaches the detection limit which is a threshold voltage below Vd2, PFET1 is turned "ON". The time required for PFET1 to conduct from the start of the fall of VPD is TDT. The voltage Vd2 connected to one side of PFET1 is a signal with the same frequency as RST but has a pulse width of Td2 and starts at the fall of RST. The voltage Vg at the other diffusion of PFET1 has the same frequency as Vd2, but displaced from Vd2 by the time TDT, and with a pulse width of TP. The width TP is preferably sufficient for performing the fusing operation through the transistor NFET2, where the current $I_F$, supplied by Vd1 (programming bias) is supposed to flow for a duration of TP.

The preferred operation of this invention will be discussed using a graded junction, where the junction capacitance C(V) is given by:

$$C(V) \times APD \times (Q \times a \times \in SI^2/12)^{1/3} \times V(t)^{-1/3} \quad (2)$$

APD is the area of the photo diode N1, Q is the electron charge which is $1.6021 \times 10^{-19}$ Coulomb, a is the net doping gradient at the junction of N1, and $\in$Sl is the permittivity of silicon which is $1.0448 \times 10^{-10}$ Farad/m. The current $I_{gr}$ is given by:

$$I_{gr} = [APD \times Q \times N_1/(2 \times \tau)] \times W \quad (3)$$

Where $N_1$ is the intrinsic carrier concentration which is equal to $1.6 \times 10^{16}/m^3$ at room temperature of 27° C., $\tau$ is the effective lifetime in the space-charge region, and W is the space-charge width, which is given by:

$$W \times [12 \times \in SI/(Q \times a)]^{1/3} \times V(t)^{1/3} \quad (4)$$

The photo current IP is given by:

$$IP = I \times APD \times H \quad (5)$$

Where I is the photosensitivity for the p-n structure, and H is the illumination level in ft.cd. For example, the following values are assigned:

$\tau = 1.6 \ \mu sec., a = 3 \times 10^{29} \ m^{-4}, I = 0.05 \ A/m^2 \cdot fc$, and $APD = 10 \ mil^2 = 6.25 \times 10^{-10} \ m^2$.

Substituting with equations (2), (3), (4), and (5), into equation (1) yields the following differential equation:

$$\{V(t)^{-2/3} \times [dV(t)/dt]\} + \{I \times H \times [12/(Q \times a \times \in SI)^{1/3}] \times V(t)^{-1/3}\} + \{[NI/(2 \times \tau)] \times [144 \times Q/(a^2 \times \in SI)^{1/3}]\} = 0 \quad (6)$$

Figure 4:
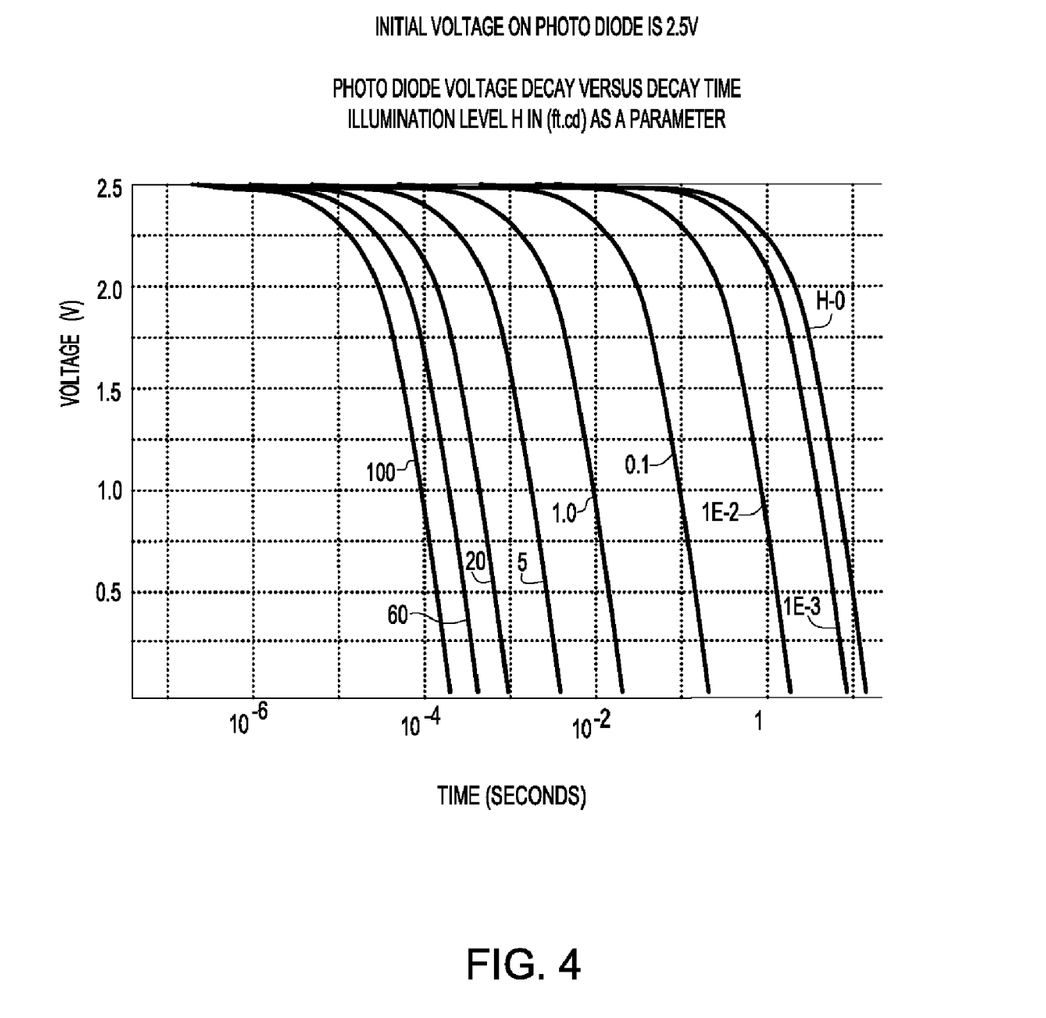
FIG. 4 is a graph showing photodiode voltage decay over time.
Figure 5:
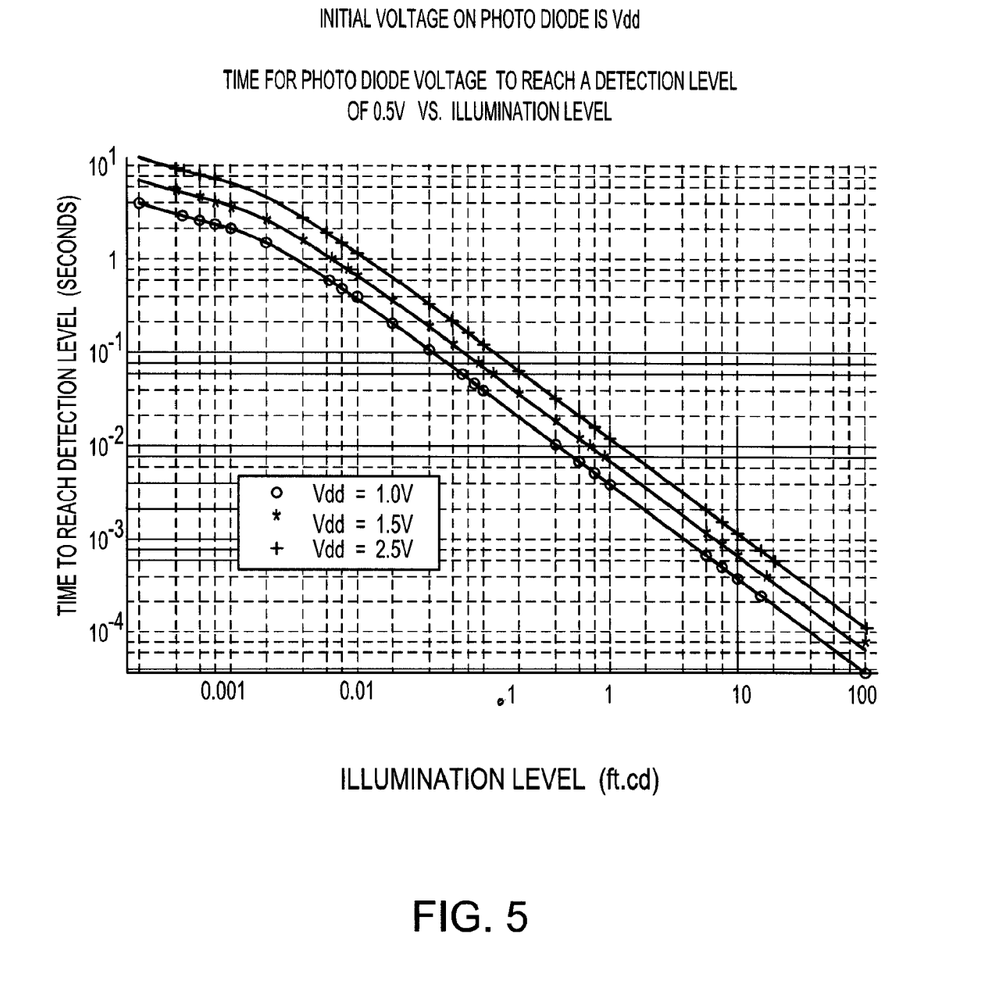
FIG. 5 is a graph showing the amount of time for a photodiode to reach a detection or threshold level as a function of the illumination level of the photodiode.

An explicit solution for equation (6) does not exist, but the equation is best solved by numerical techniques where the voltage V(t) is incremented in steps and the corresponding d(t) is calculated. FIG. 4 shows the solution of equation (6) for the voltage V(t) across the photo diode N1 as function of time with the illumination level H as parameter, for the case where the initial voltage Vdd across N1 is 2.5 V. FIG. 5 shows TDT versus illumination level with the initial voltage as a parameter, for the case where the detection level VDT is 0.5 V. TDT, as given above is the time for VPD to reach the detection level VDT which is one threshold voltage of PFET1, below voltage Vd2.

FIG. 5 shows that the detection time TDT could reach close to a second or more for very low illumination levels. And as expected, TDT decreases as the initial voltage Vdd decreases.

The e-fuse associated with transistor NFET2 in FIG. 2 may be any suitable or conventional e-fuse, and for example, may have the following operating conditions:

Programming voltage Vd1: 3.3 V
Programming NFET2 maximum current $I_{ON}$: 10 mA<$I_{ON}$<15 mA
Programming Time TP: 0.2 milli seconds=<TP<1.5 ms The operation of the invention may be demonstrated, for example, with a value of TP=0.3 ms as an operating point. For the operating point, the input voltage VRST to the gate (RST) of NFET1 is higher than the threshold voltage of NFET1 and is set at 3.3 V. The initial voltage Vdd could have values ranging from 0.7 V to 3.3 V, and the operating point is at 2.5 V. The detection level VDT, which VPD needs to reach to turn on PFET1 is 0.5 V. Vd2 is set at 1.0 V (V2) which is a threshold voltage (Vt for PFET1=−0.5 V) above VDT. Also, with Vd2=1.0 V, the voltage Vg at the gate of NFET2 (V1) is 1.0 V which is higher than the Vt of NFET2 (0.5 V). From FIG. 5, at a detection level of 0.5 V, and an initial voltage of 2.5 V, TDT is about $1.4 \times 10^{-3}$ seconds at an illumination level (H) of 10 ft.cd, and is about $10^{-4}$ seconds at an illumination level of 100 ft.cd. The illumination level of 10 ft.cd ($H_M$) considered to be the maximum background illumination that could be present, i.e. incident on the photo diode N1 without triggering (executing) the fusing operation as given by this invention. An incident illumination level of 100 ft.cd ($H_0$) is the level required to execute the fuse operation as given by this art. Also to minimize the probability that the fuse operation may be accidentally executed due to background light, a filter, as shown at 40 in FIG. 1, is chosen for placement above the photo diode N1, so that N1 would be selective only to red light.

The execution of the fuse operation for yield enhancement (wafer level) or reliability (at package level), i.e. replacing bad elements with good redundant ones, may be executed employing a red light applied for 1 second with illumination level ($H_E$) at the photodiode N1 given by:

$$H_E = H_0 \times QE \quad (7)$$

Where QE is the quantum efficiency of the system which is typically about 0.35.

Referring to FIG. 3, the above conditions for the operation are satisfied with a width of $1.6 \times 10^{-3}$ seconds for width Td2 of signal Vd2. The period TRS of the signal RST is set at 1.8 m.seconds and the width WRST of signal RST is set at 0.01 milli seconds. Different operating conditions could be utilized using FIGS. 4 and 5.

Figure 6:
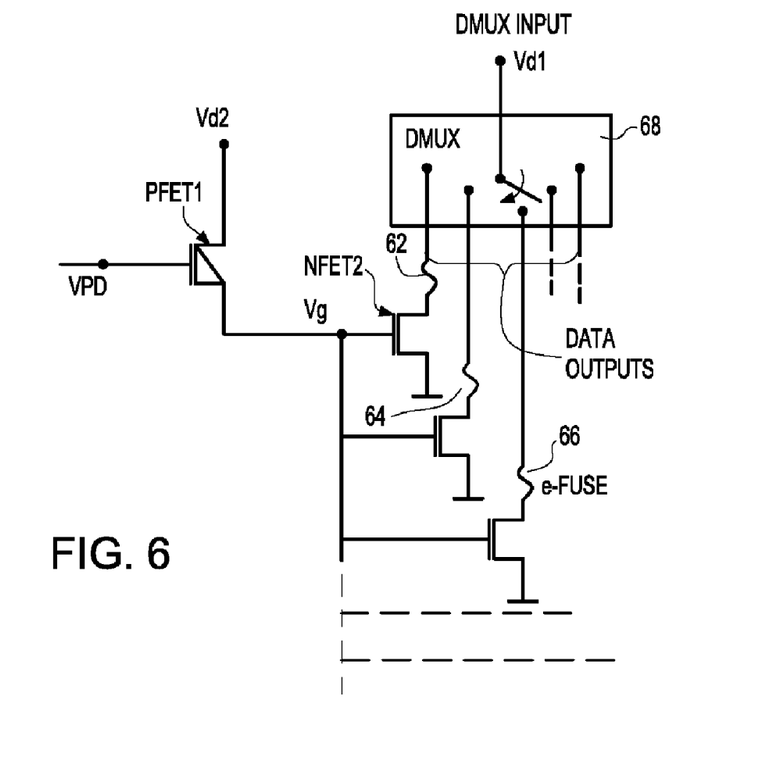
FIG. 6 is a circuit diagram illustrating how the present invention may be used for a multiple fuse application.

FIG. 6 shows the application of the invention for the case where many fuses 62, 64, 66 could replace several defect elements for yield and reliability. A De-Multiplexer 68 is used to select a fuse, one at a time for replacing bad elements with redundant ones.

Figure 7:
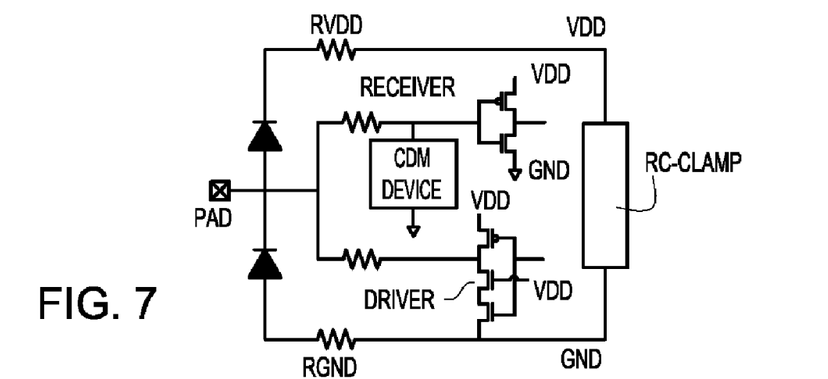
FIG. 7 is a schematic of an I/O circuit with diode based ESD protection. This ESD protection device can be disconnected from input pad by the fusing operation.

FIG. 7 illustrates a second application of the present invention. This application is for disconnecting electrostatic discharge devices (ESDs) for high speed I/O's using optical means as described above. The high speed I/O's may be, for example, part of high performance circuitry, such as ASICs which are placed on the same chip as the optical sensor. The size of ESD diodes is determined based on achieving a low on-resistance and high failure current to safely discharge ESD pulse. Goals of ESD protection devices are:

Keep I/O pad voltage (Vpad) below trigger voltage of driver (Vt1) of NFET/PFET driver; and Keep voltage at gate node (Vgate) below breakdown of gate oxide breakdown (Vox, bv) of receiver.

But ESD diodes add significant capacitance to I/O pad and this adversely affects performance of high speed I/O's. The solution of the present invention is to disconnect ESD diodes from I/O pad after packaging to eliminate impact to high speed I/O's. This can be achieved by using adequate number of e-fuses in ESD discharge path and blowing them out using optical means after packaging.

The preferred embodiment of the invention has a number of important advantages. For instance, the invention may be used effectively to provide redundancy and/or field programming of electrical function without requiring additional pins on the integrated circuit package. Also, many existing integrated circuit designs include optical sensor technology, and the invention is very well suited for incorporation into such circuit designs.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method of executing an electrical function on an integrated circuit chip, comprising the steps of:
   activating a photodiode in the chip through a spectrally selected external light activation, including the steps of charging the photodiode to a given voltage level, reducing the voltage level of the photodiode, and applying said external light to the photodiode to control the reduction of the voltage level of the photodiode; and
   using said activated photodiode to activate an electrical function on the chip, including the step of, when the voltage level of the photodiode falls below a defined level, using said voltage level to activate said electrical function; and
   wherein the charging step includes the step of applying a reset signal to the photodiode at a regular clock frequency thereby to recharge the photodiode to the given level at regular clock frequencies and whereby external light above a given illumination level is required to activate said electrical function.

2. A method according to claim 1, wherein said electrical function is disconnecting an ESD protection device from input pad.

3. A method according to claim 1, comprising the further step of applying a defined bias voltage to the photodiode, and wherein the activating step includes the step of applying said external light to the photodiode to overcome said bias voltage.

4. A method according to claim 1, comprising the further step of filtering light conducted to the photodiode to prevent ambient light from activating said photodiode.

5. The method according to claim 1, wherein:
   a program transistor is located in series with said electrical device and has on and off states; wherein activation of the photodiode activates said program transistor to switch from the off state to the on state, the on state activating current to pass through said electrical device to activate said electrical device to perform said electrical function;
   a threshold transistor is located in series between the photodiode and said program transistor for determining the voltage level at which the program transistor switches from the off state to the on state;

the voltage of the photodiode is applied to the threshold transistor to activate the threshold transistor at defined times;

a reference voltage is applied to the threshold transistor, and the threshold transistor, when activated, applies a voltage Vg to the program transistor;

the reference voltage is applied to the threshold transistor as the same frequency as the reset signal is applied to the photodiode; and the reference voltage and the reset signal have respective pulse widths, and the pulse width of the reference voltage is greater than the pulse width of the reset signal.

6. An integrated circuit structure, comprising:

a series of semiconductor layers, one of said layers including a photodiode;

an electrical device for performing an electrical function in the integrated circuit; and an activation circuit connecting the photodiode and said electrical device, and for charging the photodiode to a given voltage level; wherein the voltage level of the photodiode declines, and when the voltage level of the photodiode falls below a defined level, said voltage level causes said electrical device to perform said electrical function; and wherein the charging includes applying a reset signal to the photodiode at a regular clock frequency thereby to recharge the photodiode to the given level at regular clock frequencies and whereby external light above a given illumination level is required to activate said electrical function.

7. An integrated circuit structure according to claim 6, wherein the photodiode is activated, to cause said electrical device to perform said electrical function, when the voltage across the photodiode falls below a threshold level.

8. An integrated circuit structure according to claim 7, wherein:

said activation circuit includes a program transistor located in series with said electrical device and having on and off states; wherein activation of the photodiode activates said program transistor to switch from the off state to the on state, the on state activating current to pass through said electrical device to activate said electrical device to perform said electrical function.

9. An integrated circuit structure according to claim 8, wherein the activation circuit further includes threshold transistor located in series between the photodiode and said program transistor for determining the voltage level at which the program transistor switches from the off state to the on state.

10. An integrated circuit structure according to claim 6, wherein said electrical device is an electrostatic discharge device used in conjunction with disconnecting an ESD protection device from input pad.

11. A method of fabricating a semiconductor structure, comprising the steps of:

forming a series of layers to form an integrated circuit;

embedding a variable voltage photodiode in one of said layers;

providing the integrated circuit with an electrical device for performing an electrical function, and with an activation circuit connecting the photodiode with said electrical device, the activation circuit including a circuit portion for charging the photodiode to a defined voltage;

wherein activation of the photodiode is used to cause said electrical device to perform said function; and wherein incident light is used to control reduction of the voltage of the photodiode, and when the voltage of the photodiode falls below a defined level, said voltage level causes the electrical function to activate; and wherein the charging includes applying a reset signal to the photodiode at a regular clock frequency thereby to recharge the photodiode to the given level at regular clock frequencies and whereby external light above a given illumination level is required to activate said electrical function.

12. A method according to claim 11, wherein said activation circuit includes a reset means connected to the photodiode to apply a defined voltage to the photodiode.

13. A method according to claim 11, wherein another one of said layers is a light filter to prevent ambient light from activating said photodiode.

14. A method according to claim 11, comprising the further step of providing the integrated circuit with a lens for focusing selected light onto the photodiode to activate said photodiode.

15. A method according to claim 11, wherein:

said one of said layers is a p-epi layer; and the embedding step includes the step of forming an N+ well in said p-epi layer to form said photodiode.

* * * * *